United States Patent
Jung et al.

(10) Patent No.: US 10,566,818 B2
(45) Date of Patent: Feb. 18, 2020

(54) BATTERY CHARGING METHOD, BATTERY CHARGING INFORMATION GENERATING METHOD, AND BATTERY CHARGING APPARATUS

(71) Applicant: SAMSUNG ELECTRONICS CO., LTD., Suwon-si (KR)

(72) Inventors: Daeryong Jung, Seoul (KR); Jinho Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 124 days.

(21) Appl. No.: 15/788,134

(22) Filed: Oct. 19, 2017

(65) Prior Publication Data

US 2018/0145531 A1    May 24, 2018

(30) Foreign Application Priority Data

Nov. 18, 2016    (KR) .................. 10-2016-0154239

(51) Int. Cl.
*H02J 7/00* (2006.01)
*G01R 31/382* (2019.01)
*G01R 31/374* (2019.01)
*H01M 10/44* (2006.01)

(52) U.S. Cl.
CPC .......... *H02J 7/0073* (2013.01); *G01R 31/374* (2019.01); *G01R 31/382* (2019.01)

(58) Field of Classification Search
CPC ... G01R 31/374; G01R 31/382; H02J 7/0021; H02J 7/0073; H02J 7/00; H02J 7/0091; H02J 7/0052; H02J 2007/0098; Y02T 10/7055; H01M 10/443; H01M 10/44
See application file for complete search history.

(56) References Cited

U.S. PATENT DOCUMENTS

2014/0172333 A1\* 6/2014 Gopalakrishnan ........................... G01R 31/3835
    702/63
2014/0292283 A1\* 10/2014 Timmons ............ B60L 11/1809
    320/152

(Continued)

FOREIGN PATENT DOCUMENTS

CN    100391080 C    5/2008
EP    2 947 748 A1    11/2015

(Continued)

OTHER PUBLICATIONS

Extended European Search Report dated May 9, 2018 in the European Patent Application No. 17201117.3 (7 pages in English).

*Primary Examiner* — Vuthe Siek
(74) *Attorney, Agent, or Firm* — NSIP Law (57) ABSTRACT

Provided are a battery charging method, a battery charging information generating method, and a battery charging apparatus. The battery charging apparatus may measure a temperature of a battery, may estimate a state of charge (SOC) and a state of health (SOH) of the battery, may acquire an F mapping relationship that maps F values to C-rates and SOCs at the temperature and the SOH, the F value denoting a ratio of variation of SOC to variation of voltage, and may generate a charging profile that is a sequence of charging C-rates for each of the SOCs for charging the battery based on the estimated SOC and the F mapping relationship.

18 Claims, 10 Drawing Sheets

(56) References Cited

U.S. PATENT DOCUMENTS

| | | | |
|---|---|---|---|
| 2015/0280290 A1* | 10/2015 | Saha | H01M 10/48 429/50 |
| 2016/0049821 A1* | 2/2016 | Aridome | H02J 7/0073 320/128 |
| 2016/0052505 A1* | 2/2016 | Zhou | B60L 7/14 701/22 |
| 2016/0064957 A1 | 3/2016 | Card et al. | |
| 2016/0072313 A1 | 3/2016 | Satou et al. | |
| 2016/0172887 A1 | 6/2016 | Lin et al. | |
| 2017/0288417 A1* | 10/2017 | Trichy | H02J 7/007 |

FOREIGN PATENT DOCUMENTS

| | | |
|---|---|---|
| JP | 2012-191782 A | 10/2012 |
| JP | 2015-171208 A | 9/2015 |
| KR | 10-2010-0116030 A | 10/2010 |
| KR | 10-2013-0098611 A | 9/2013 |
| KR | 10-2013-0120232 A | 11/2013 |
| KR | 10-2013-0127792 A | 11/2013 |
| KR | 10-2015-0089626 A | 8/2015 |
| KR | 10-2017-0082258 A | 7/2017 |

\* cited by examiner

BATTERY CHARGING METHOD, BATTERY CHARGING INFORMATION GENERATING METHOD, AND BATTERY CHARGING APPARATUS

CROSS-REFERENCE TO RELATED APPLICATIONS

This application claims the benefit under 35 USC § 119(a) of Korean Patent Application No. 10-2016-0154239 filed on Nov. 18, 2016 in the Korean Intellectual Property Office, the entire disclosure of which is incorporated herein by reference for all purposes.

BACKGROUND

1. Field

The following description relates to battery charging technology.

2. Description of Related Art

A battery is used as a power source of, for example, a mobile device, an electric vehicle, etc. A variety of schemes for charging the battery have been proposed. In general, a widely used constant current/constant voltage (CC/CV) charging scheme charges a battery with a constant current up to a specific voltage and then charges the battery with a constant voltage until the battery reaches a preset low current. In addition, a multi-step charging scheme of charging a battery with multi-step constant currents from a high current to a low current and a pulse charging scheme of repeatedly applying a pulse current based on a relatively short time unit are used.

The CC/CV charging scheme takes a relatively large amount of time under a constant voltage condition and thus, is unsuitable for fast charging. The multi-step charging scheme and the pulse charging scheme may cause degradation of the battery due to fast charging. As a number of persons using an electric vehicle or a mobile device to which a battery is mounted increases, the demand for fast charging also increases. Accordingly, there is a need for developing a battery charging technology that provides fast charging and show a relatively excellent battery life characteristic.

SUMMARY

The generating of the charging profile may include extracting F values corresponding to the estimated SOC from the F mapping relationship, determining a charging C-rate corresponding to the estimated SOC based on the F values corresponding to the estimated SOC, extracting F values corresponding to a subsequent SOC of the estimated SOC from the F mapping relationship, and determining a charging C-rate corresponding to the subsequent SOC based on the F values corresponding to the subsequent SOC.

In one general aspect, a battery charging method includes measuring a temperature of a battery, estimating a state of charge (SOC) and a state of health (SOH) of the battery, acquiring an F mapping relationship that maps F values to C-rates and SOCs at the temperature and the SOH, the F value denoting a ratio of variation of SOC to variation of voltage, and generating a charging profile that is a sequence of charging C-rates for each SOC for charging the battery based on the estimated SOC and the F mapping relationship.

The generating of the charging file may include extracting F values corresponding to the estimated SOC from the F mapping relationship, determining a charging C-rate corresponding to the estimated SOC based on the F values corresponding to the estimated SOC, extracting F values corresponding to a subsequent SOC of the estimated SOC from the F mapping relationship, and determining a charging C-rate corresponding to the subsequent SOC based on the F values corresponding to the subsequent SOC.

The determining of the charging C-rate corresponding to the estimated SOC may include determining a C-rate corresponding to a largest F value among the F values corresponding to the estimated SOC extracted from the F mapping relationship as the charging C-rate corresponding to the estimated SOC.

The determining of the charging C-rate corresponding to the subsequent SOC may include extracting C-rates corresponding to the subsequent SOC from the F mapping relationship, determining C-rates greater than the charging C-rate corresponding to the estimated SOC within a predetermined range among the extracted C-rates, as candidate C-rates, and determining a C-rate corresponding to a largest F value among F values corresponding to the candidate C-rates as the charging C-rate corresponding to the subsequent SOC.

The determining of the charging C-rate corresponding to the subsequent SOC may include extracting C-rates corresponding to the subsequent SOC from the F mapping relationship, determining C-rates less than the charging C-rate corresponding to the estimated SOC among the extracted C-rates, as candidate C-rates, and determining a C-rate corresponding to a largest F value among F values corresponding to the candidate C-rates as the charging C-rate corresponding to the subsequent SOC.

The generating of the charging profile may include deriving the charging C-rates for each SOC that minimize a value of a fitness function from the F mapping relationship using a genetic algorithm, and the fitness function may be designed so that any one or any combination of the F values, the C-rates, and the SOCs mapped based on the F mapping relationship is input.

The fitness function may be designed so that a C-rate corresponding to an SOC to be input to the fitness function is input to the fitness function as a small value according to an increase in the SOC to be input to the fitness function.

The battery charging method may further include receiving a required charging time that is a charging time desired by a user. The generating of the charging profile may include determining whether the battery is chargeable within the required charging time based on the estimated SOC and the required charging time, and generating the charging profile for charging the battery within the required charging time in response to the battery being determined to be chargeable.

The generating of the charging profile may include generating charging profiles corresponding to the required charging time from the F mapping relationship in response to the battery being determined to be chargeable, and generating the charging profile using a charging profile having a largest end of life (EOL) among the generated charging profiles.

The determining whether the battery is chargeable may include comparing the required charging time to a threshold time corresponding to the estimated SOC or determining whether the battery is chargeable based on the F values.

The generating of the charging profile may include inserting at least one rest period between the charging C-rates.

In another general aspect, a battery charging information generating method includes generating an F mapping relationship of a battery corresponding to a specific temperature and a specific SOH by mapping F values for each C-rate to SOCs, the F value denoting a ratio of variation of SOC to variation of voltage, and generating F mapping relationships corresponding to temperatures including the specific temperature and SOHs including the specific SOH based on the F mapping relationship. The generating of the F mapping relationship includes measuring F values corresponding to SOCs that increase in response to charging the battery of the specific temperature and the specific SOH at a specific C-rate, and mapping the measured F values to the specific C-rate and the increasing SOCs.

The measuring of the F values may include one or both of charging the battery using a constant current/constant voltage (CC/CV) charging scheme of the specific C-rate, and charging the battery using a step charging scheme including the specific C-rate.

The measuring of the F values may include measuring the F values corresponding to the increasing SOCs based on F values measured in response to charging the battery using the CC/CV charging scheme and F values measured in response to charging the battery using the step charging scheme.

In another general aspect, a battery charging apparatus includes a processor configured to measure a temperature of a battery, to estimate an SOC and an SOH of the battery, to acquire an F mapping relationship that maps F values to C-rates and SOCs at the temperature and the SOH, the F value denoting a ratio of variation of SOC to variation of voltage, and to generate a charging profile that is a sequence of charging C-rates for each SOC for charging the battery based on the estimated SOC and the F mapping relationship.

Other features and aspects will be apparent from the following detailed description, the drawings, and the claims.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 1:
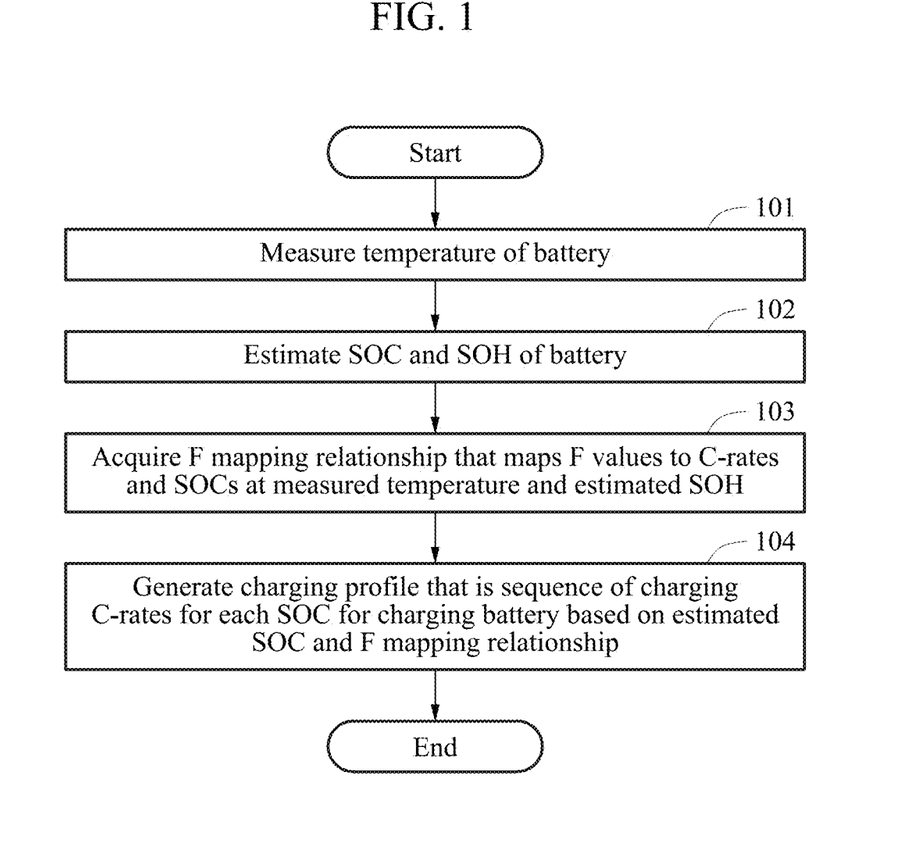
FIG. 1 is a flowchart illustrating an example of a battery charging method.

FIG. 1 illustrates an example of a battery charging method.

Referring to FIG. 1, in operation 101, a battery charging apparatus measures a temperature of a battery. Here, measuring the temperature of the battery includes directly measuring the temperature of the battery that is a target to be charged or acquiring a temperature measured at a separate apparatus. The battery includes a charger or a secondary cell configured to store power by charging, and a device to which the battery is mounted supplies the power from the battery to a load. The load is an entity that consumes the power and may consume the power supplied from an outside. For example, the load includes an electric heater, a light, a motor of an electric vehicle, and the like, that consume the power using a circuit in which current flows at a specific voltage.

The battery charging apparatus charges the battery, and is configured as a software module, a hardware module, or a combination thereof. For example, the battery charging apparatus is configured by a battery management system (BMS). The BMS is a system that manages the battery, and for example, monitors a state of the battery, maintains an optimal condition for an operation of the battery, predicts a replacement timing of the battery, detects a fault of the battery, generates a control signal or a command signal associated with the battery, and controls the state or the operation of the battery.

In operation 102, the battery charging apparatus estimates a state of charge (SOC) and a state of health (SOH) of the battery. The SOC is a parameter that indicates a charging state of the battery. Since the SOC indicates a level of energy stored in the battery, an amount of energy stored in the battery is indicated as 0 to 100% using a percentage unit. For example, 0% indicates a completely discharged state and 100% indicates a fully charged state. This representation method may be variously modified and defined based on the design intent or example embodiments.

The SOH is a parameter that quantitatively indicates a change in a battery life characteristic of the battery due to effects of aging, for example, a degradation phenomenon. The SOH indicates a level of degradation in the battery life or capacity of the battery. A variety of schemes may be employed when the battery charging apparatus estimates the SOC and the SOH.

In operation 103, the battery charging apparatus acquires an F mapping relationship that maps F values to C-rates and SOCs at the measured temperature and the estimated SOH. Here, the F value denotes a ratio of variation of SOC to variation of voltage and is represented as Equation 1.

$$F = \Delta SOC / \Delta V \quad \text{[Equation 1]}$$

In response to charging the battery, the voltage of the battery increases and an SOC of the battery increases. Here, the F value is acquired by dividing the variation of SOC of the battery by the variation of voltage of the battery.

The C-rate indicates a battery related current characteristic that denotes a charging and discharging rate of current according to the battery capacity and the unit of [C] is used. For example, if the battery capacity is 1000 mAh, a current amount available for 1 hour, and charging and discharging current is 1 A, the C-rate is 1 C=1 A/1000 mAh.

The F mapping relationship denotes a relationship in which F values are mapped to C-rates and SOCs based on a specific temperature and a specific SOH. The battery charging apparatus may acquire the F mapping relationship corresponding to the measured temperature and the estimated SOH from a preconfigured database. The database may be configured as a memory included in the battery charging apparatus, or may be configured as an external apparatus, for example, a server, etc., connected to a network and the like in a wired and/or wireless manner.

Figure 2:
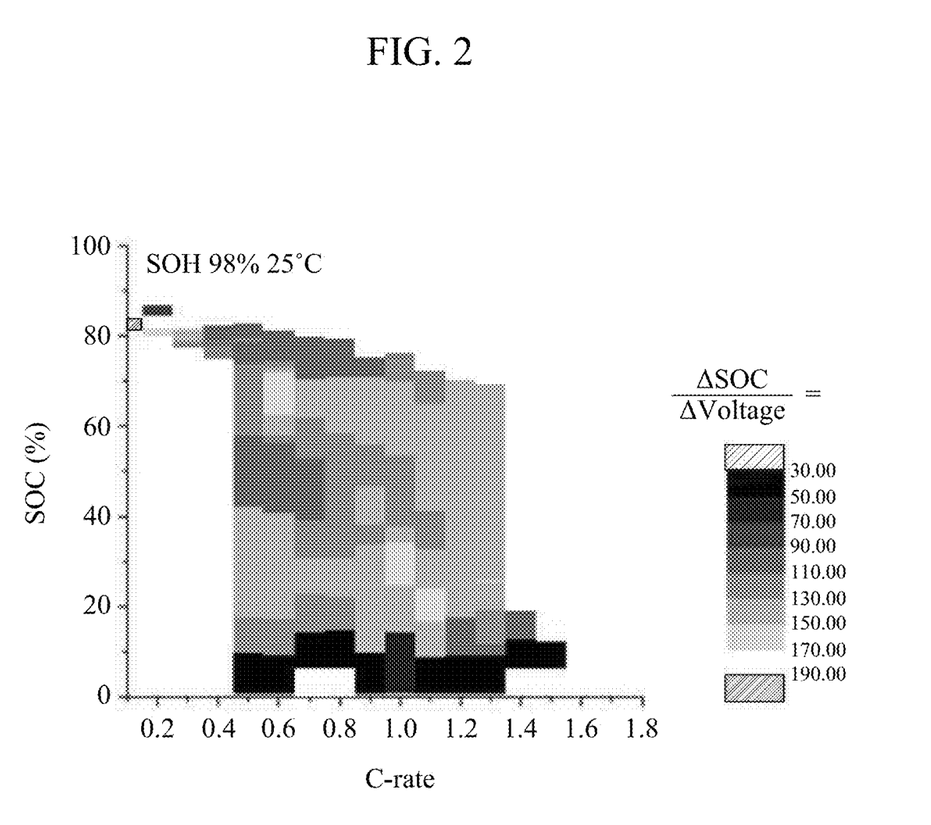
FIG. 2 is a graph showing an example of an F mapping relationship.

FIG. 2 is a graph showing an example of an F mapping relationship.

The graph of FIG. 2 represents the F mapping relationship in which F values are mapped to C-rates and SOCs based on a condition that the temperature of the battery is 25° C. and the SOH of the battery is 95%. Referring to FIG. 2, an F mapping relationship corresponding to a specific temperature and a specific SOH of the battery represent an F value corresponding to a specific C-rate and a specific SOC and thus, be three-dimensionally represented.

For example, if the measured temperature of the battery is 25° C. and the estimated SOH of the battery is 95%, the battery charging apparatus acquires, from a database, the F mapping relationship of FIG. 2 among F mapping relationships corresponding to SOHs and temperatures. Although FIG. 2 illustrates that C-rates, SOCs, and F values are distinguished for each discrete section, it is provided as an example only. The F mapping relationship may be represented using continuous values.

In operation 104, the battery charging apparatus generates a charging profile that is a sequence of charging C-rates for each SOC for charging the battery based on the estimated SOC and the F mapping relationship. The charging profile refers to a policy for supplying a current by charging and may be defined as a sequence of C-rates for charging. Here, a C-rate that defines the charging profile for charging is referred to as a charging C-rate.

In response to charging the battery, the SOC increases. Charging C-rates for each SOC increasing in response to charging are set based on a charging policy. Accordingly, the battery charging apparatus generates a charging profile that is a sequence of charging C-rates for each SOC from the estimated SOC of the battery to an SOC corresponding to a point in time at which charging is completed. The battery charging apparatus uses the F mapping relationship corresponding to the measured temperature and the estimated SOH of the battery to set charging C-rates for each SOC. For example, if the measured temperature of the battery is 25° C., the estimated SOH of the battery is 95%, and the estimated SOC is 10%, the battery charging apparatus determines charging C-rates for each section from a charging C-rate corresponding to the SOC of 10% to a charging C-rate corresponding to the SOC of 100% based on F values of the F mapping relationship of FIG. 2

In one example, the battery charging apparatus extracts F values corresponding to the estimated SOC of the battery from the F mapping relationship corresponding to the temperature and the SOH of the battery. The battery charging apparatus determines a charging C-rate corresponding to the estimated SOC of the battery based on the F values corresponding to the estimated SOC. Referring to FIG. 2, if the estimated SOC of the battery is 10%, the battery charging apparatus extracts a single F value from among F values corresponding to the SOC of 10% and determines a C-rate corresponding to the extracted F value as a charging C-rate corresponding to the SOC of 10%.

The battery charging apparatus extracts F values corresponding to a subsequent SOC of the estimated SOC from the F mapping relationship. The battery charging apparatus determines a charging C-rate corresponding to the subsequent SOC based on the F values corresponding to the subsequent SOC. Referring to FIG. 2, if the subsequent SOC of the estimated SOC is 15%, the battery charging apparatus extracts a single F value from among F values corresponding to the SOC of 15% and determines a C-rate corresponding to the extracted F value as a charging C-rate corresponding to the SOC of 15%. The battery charging apparatus determines charging C-rates corresponding to each SOC using the above method and generates a charging profile that is a sequence of charging C-rates for each SOC.

Figure 3:
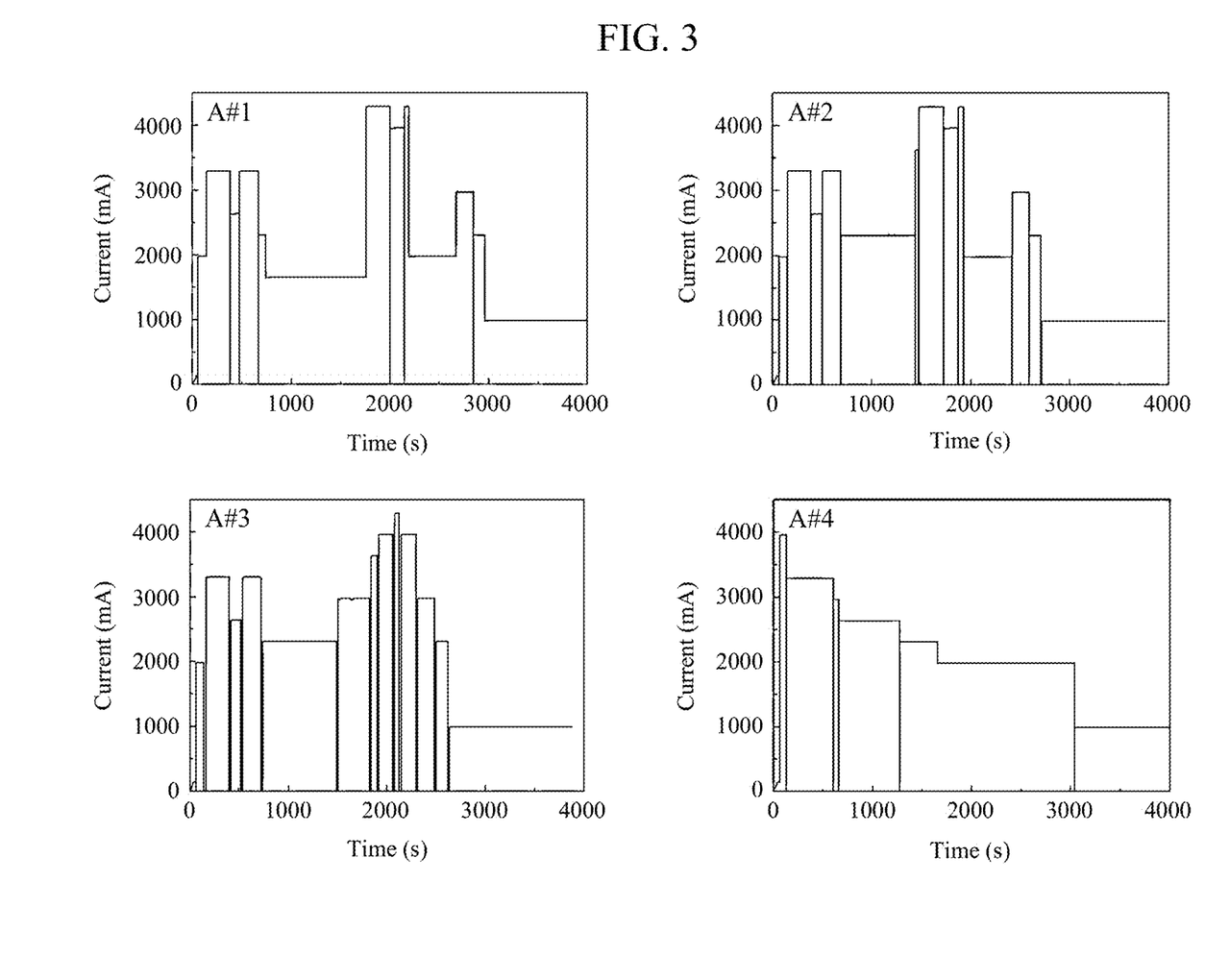
FIG. 3 illustrates examples of a charging profile.

FIG. 3 illustrates examples of a charging profile.

A variety of algorithms may be used to derive a charging profile from an F mapping relationship. For example, the following first to fourth algorithms are applicable.

Hereinafter, the first to fourth algorithms are described.

First algorithm: charging is performed at a C-rate corresponding to a largest F value.

Second algorithm: apply the first algorithm if $I_{i+1} - I_i \leq 0.4$ C.

Third algorithm: apply the first algorithm if $I_{i+1} - I_i \leq 0.2$ C.

Fourth algorithm: apply the first algorithm if $I_{i+1} < I_i$.

Here, $I_i$ and $I_{i+1}$ denote an charging C-rate and an $(i+1)^{th}$ charging rate, respectively, in a sequence of charging C-rates included in the charging profile.

According to the first algorithm, the battery charging apparatus extracts the largest F value from among F values corresponding to a specific SOC extracted from the F mapping relationship, and determines a C-rate corresponding to the extracted F value as a charging C-rate corresponding to the specific SOC.

According to the second algorithm, the battery charging apparatus extracts C-rates corresponding to an $(i+1)^{th}$ SOC from the F mapping relationship, and determines C-rates greater than $I_i$ within a predetermined range, for example, 0.4 C, among the extracted C-rates, as candidate C-rates. The battery charging apparatus determines a C-rate corresponding to the largest F value among F values corresponding to the candidate C-rates as $I_{i+1}$.

According to the third algorithm, the battery charging apparatus extracts C-rates corresponding to the $(i+1)^{th}$ SOC from the F mapping relationship, and determines C-rates greater than $I_i$ within the predetermined range, for example, 0.2 C, among the extracted C-rates, as candidate C-rates. The battery charging apparatus determines a C-rate corresponding to the largest F value among F values corresponding to the candidate C-rates as $I_{i+1}$.

According to the fourth algorithm, the battery charging apparatus extracts C-rates corresponding to the $(i+1)^{th}$ SOC from the F mapping relationship, and determines C-rates less than $I_i$ among the extracted C-rates as candidate C-rates. The battery charging apparatus determines a C-rate corresponding to the largest F value among F values corresponding to the C-rates as $I_{i+1}$.

For example, the battery charging apparatus generates charging profiles from the F mapping relationship of FIG. 2 using the first to fourth algorithms. Graphs A #1, A #2, A #3, and A #4 of FIG. 3 show charging profiles derived from the F mapping relationship of FIG. 2, using the first algorithm, the second algorithm, the third, algorithm, and the fourth algorithm, respectively.

In one example, the battery charging apparatus generates a charging profile by inserting at least one rest period between charging C-rates. The charging profile into which the rest period is inserted enhances a battery life characteristic of the battery. The first to fourth algorithms are provided as examples only to derive a charging profile from the F mapping relationship. The battery charging apparatus derives the charging profile from the F mapping relationship corresponding to a battery condition using a variety of schemes.

Figure 4A:
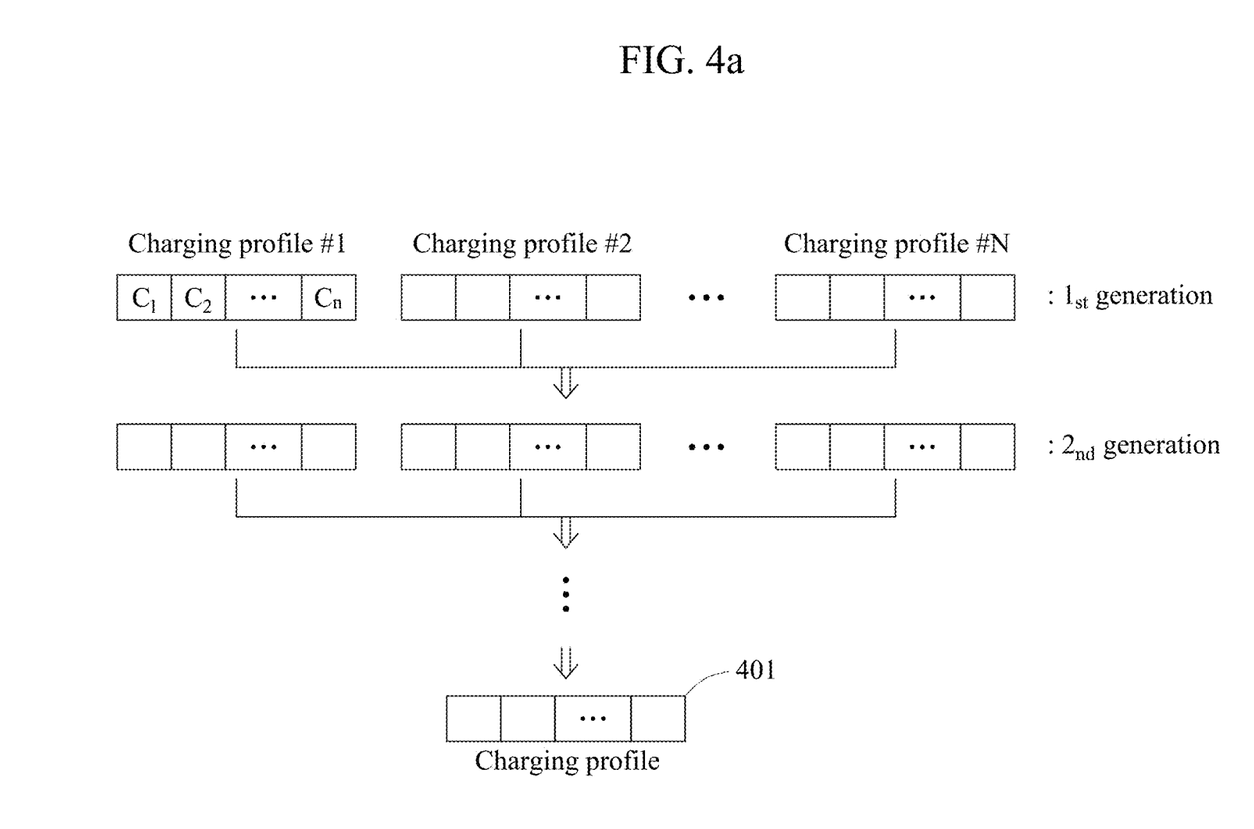
FIG. 4A illustrates an example of a genetic algorithm.

FIG. 4A illustrates an example of a genetic algorithm.

In one example, the battery charging apparatus uses a genetic algorithm to derive a charging profile from an F mapping relationship. The genetic algorithm is a scheme of solving a fitness issue by copying a genetic scheme of nature. For example, the genetic algorithm is used to find a solution of a fitness function.

The battery charging apparatus may derive, from the F mapping relationship using the genetic algorithm, a charging profile that minimizes the fitness function among charging profiles set as a sequence of charging C-rates. Referring to FIG. 4A, the battery charging apparatus randomly sets charging profiles (charging profile #1 to charging profile # N) of a first generation. The battery charging apparatus derives new charging profiles from the first generation charging profiles using operations, for example, selection, alternation, variation, etc., of the genetic algorithm, and applies the derived charging profiles to the fitness function. The battery charging apparatus selects charging profiles of a second generation from among the newly derived charging profiles based on values of the fitness function. For example, the battery charging apparatus derives the second generation charging profiles by comparing the values of the fitness function to a threshold or based on a large/small relationship between the values of the fitness function.

In one example, the fitness function is designed so that any one or any combination of F values, C-rates, and SOCs mapped based on the F mapping relationship is input. Here, the F mapping relationship corresponds to a specific temperature and a specific SOH of the battery. For example, the fitness function is defined as expressed by Equation 2.

$$\text{Fitness Function} = \sum_{SOC=6}^{86} -\left[(w1 \times F) + w2 \times (2.1 - C_{Rate}) \times \left(\frac{SOC}{10}\right)^n\right] \quad \text{[Equation 2]}$$

In Equation 2, each of w1 and w2 denotes a weight, $C_{Rate}$ denotes a charging C-rate of a charging profile, SOC denotes an SOC corresponding to the charging C-rate of the charging profile, F denotes an F value corresponding to $C_{Rate}$ and SOC based on the F mapping relationship, and n denotes an index of SOC. For example, the battery charging apparatus derives a charging profile using a solution that minimizes a value of the fitness function of Equation 2. Here, the derived charging profile is a sequence of charging C-rates for each SOC from SOC=6% to SOC=86%.

Referring to Equation 2, the coefficient of $C_{Rate}$ exponentially increases based on an increment in SOC. In the fitness function of Equation 2, a relatively great weight is assigned to small $C_{Rate}$ based on an increment in SOC. It can be known from Equation 2 that a battery life characteristic is enhanced by assigning a small C-rate based on an increment in SOC when designing the charging profile. The fitness function is designed so that a C-rate corresponding to an SOC to be input to the fitness function is input to the fitness function as a small value based on an increment in the SOC to be input to the fitness function.

Referring to FIG. 4A, the battery charging apparatus generates charging profiles of a subsequent generation from the second charging profiles and derives a final charging profile 401 by repeating the above method. A number of iterations of an operation of deriving charging profiles of a subsequent generation is defined in advance, or is defined by comparing a value of a fitness function to a threshold, by comparing variation of a value of the fitness function to the threshold, and the like. However, without being limited thereto, a variety of schemes may be applied.

In one example, the battery charging apparatus receives a required charging time that is a charging time desired by a user, and derives the charging profile based on the received required charging time. For example, the battery charging apparatus generates a charging profile that minimizes a value of the fitness function within the required charging time, using a genetic algorithm. The battery charging apparatus extracts only charging profiles chargeable within the required charging time from among the charging profiles derived using the genetic algorithm, and generates an optimized charging profile using the genetic algorithm among the extracted charging profiles.

Figure 4B:
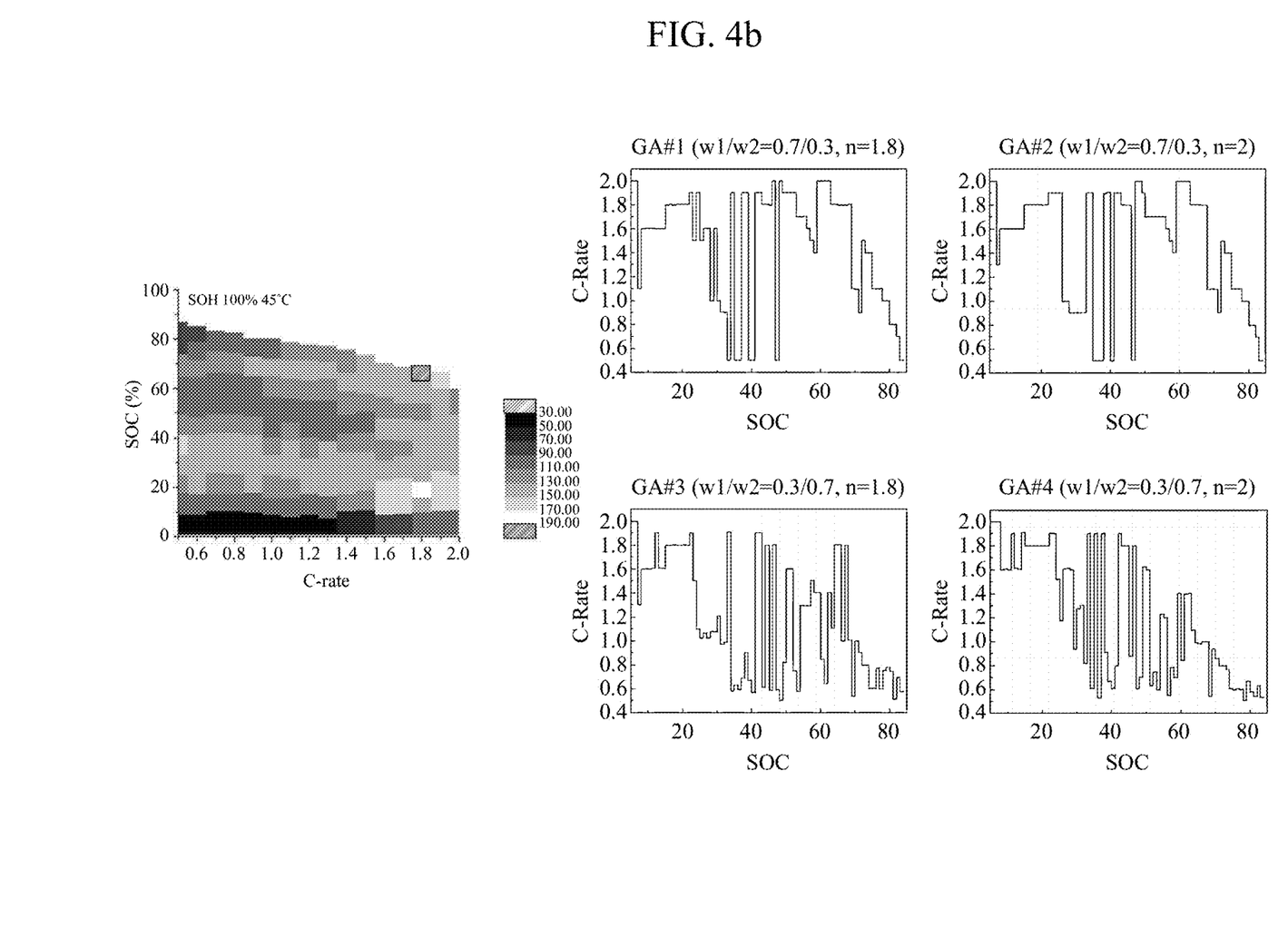
FIG. 4B illustrates examples of a charging profile.

FIG. 4B illustrates examples of a charging profile.

As described above with FIG. 4A, the battery charging apparatus generates a charging profile from an F mapping relationship corresponding to a specific temperature and an SOH, using a genetic algorithm. Graphs GA #1, GA #2, GA #3, and GA #4 of FIG. 4B show charging profiles derived using the genetic algorithm from the F mapping relationship based on a condition that the SOH of the battery is 100% and the temperature of the battery is 45° C. and the fitness function of Equation 2.

Figure 5:
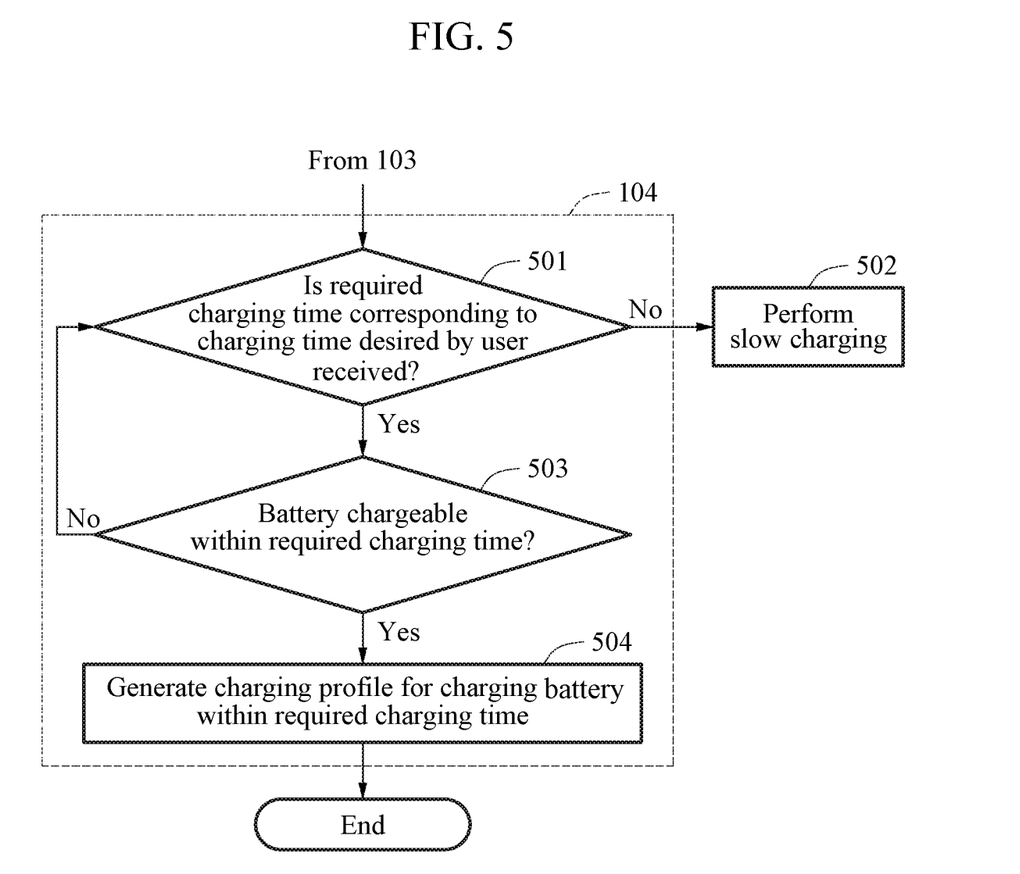
FIG. 5 is a flowchart illustrating an example of a battery charging method.

FIG. 5 illustrates an example of a battery charging method.

Referring to FIG. 5, in operation 501, the battery charging apparatus receives a required charging time that is a charging time desired by a user. The required charging time is input from a user of an electronic device to which the battery is mounted. In operation 502, the battery charging apparatus performs slow charging of the battery in response to a failure in receiving the required charging time.

In operation 503, the battery charging apparatus determines whether the battery is chargeable within the required charging time. The battery charging apparatus determines whether the battery is chargeable within the required charging time based on the estimated SOC and the required charging time. For example, a threshold time corresponding to the temperature, the SOH, and the SOC of the battery is recorded in advance in a database, and the battery charging apparatus determines whether the battery is chargeable by comparing the recorded threshold time and the required charging time. Alternatively, the battery charging apparatus may determine whether the battery is chargeable based on F values of the F mapping relationship corresponding to the temperature and the SOH of the battery.

In operation 504, if the battery is determined to be chargeable within the required charging time, the battery charging apparatus generates a charging profile for charging the battery. In one example, the battery charging apparatus generates charging profiles that satisfy the required charging time from the F mapping relationship, and selects a charging profile having a largest end of life (EOL) from among the generated charging profiles.

Figure 6:
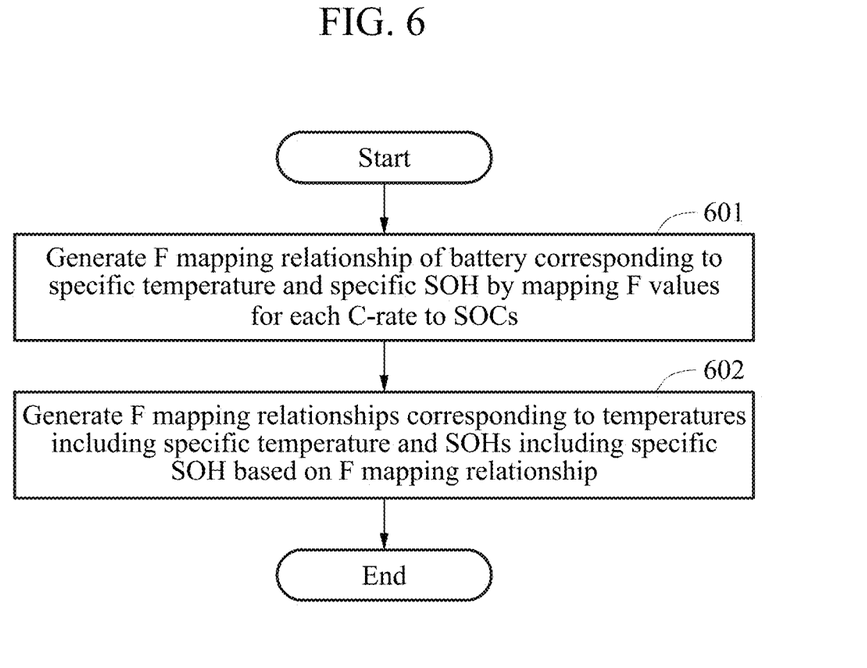
FIG. 6 is a flowchart illustrating an example of a battery charging information generating method.

FIG. 6 illustrates an example of a battery charging information generating method.

Figure 7:
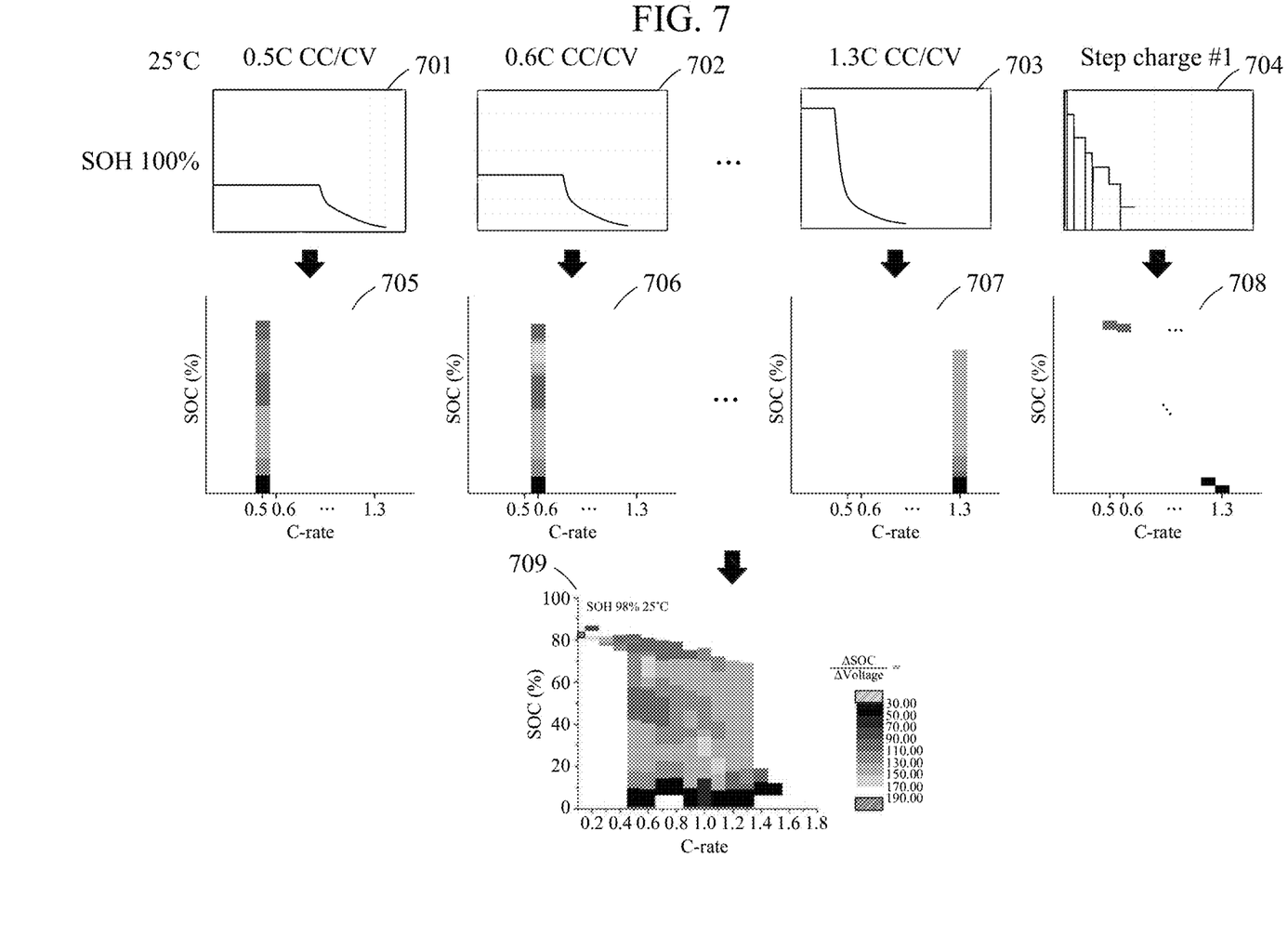
FIG. 7 illustrates an example of describing a battery charging information generating method.
Figure 8:
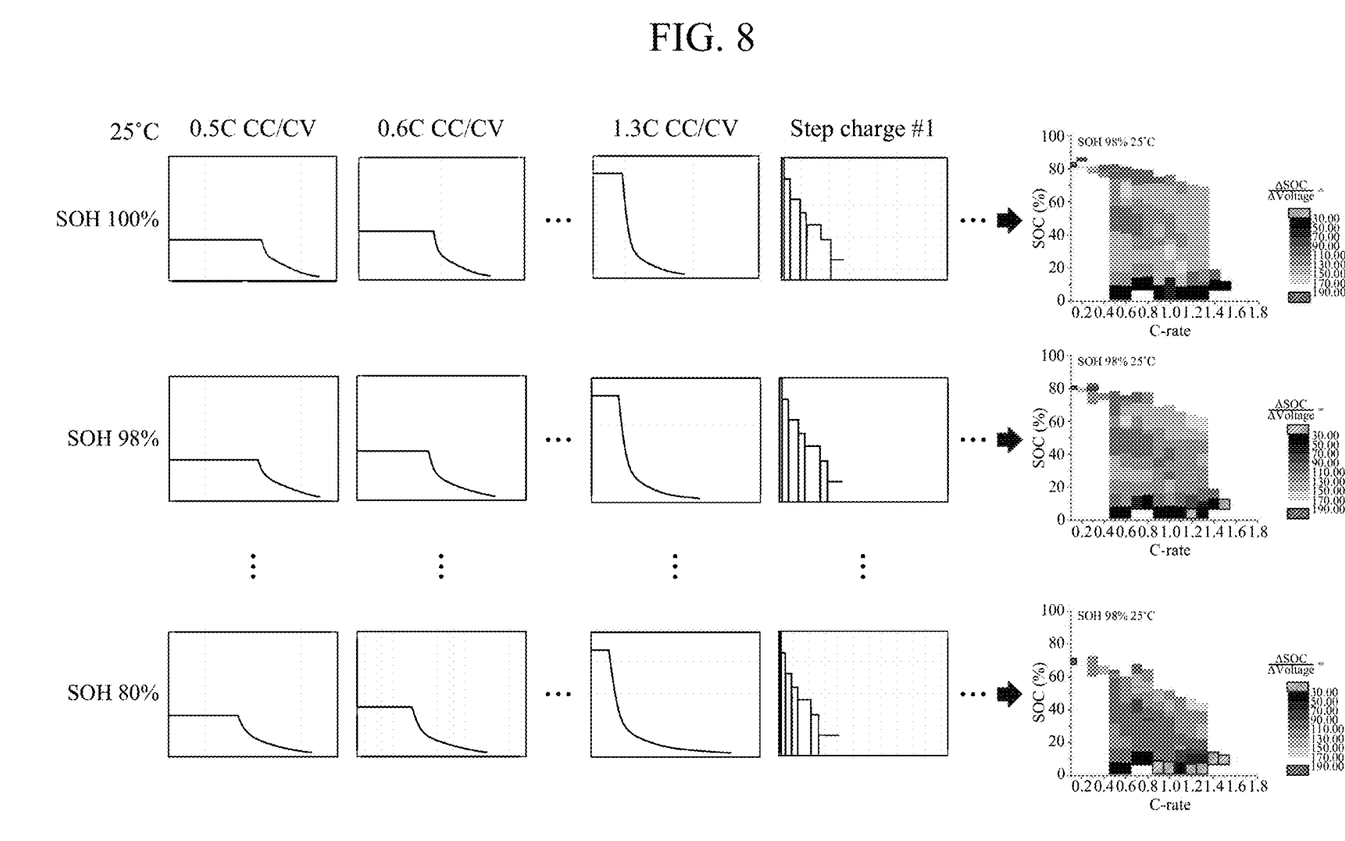
FIG. 8 illustrates an example of describing a battery charging information generating method.

As described above, the battery charging apparatus acquires an F mapping relationship corresponding to a temperature and an SOH of a battery from mapping relationships and generates a charging profile based on F values of the acquired F mapping relationship. Here, the F mapping relationships are recorded in advance in a database. A method of generating battery charging information that includes F mapping relationships will be described with reference to FIGS. 6 through 8. The battery charging information generating method to be described with reference to FIGS. 6 through 8 is performed at the battery charging apparatus. The battery charging apparatus that performs the battery charging information generating method may be identical to an entity that generates the charging profile, and may be a separate entity, and may be configured as a software module, a hardware module, or a combination thereof.

In operation 601, the battery charging apparatus generates an F mapping relationship of a battery corresponding to a specific temperature and a specific SOH by mapping F values for each C-rate to SOCs. The battery charging apparatus measures F values corresponding to SOCs that increase in response to charging the battery of the specific temperature and the specific SOH at a specific C-rate. The battery charging apparatus maps the measured F values to the specific C-rate and the increasing SOCs. A process of generating the F mapping relationship of the battery corresponding to the specific temperature and the specific SOH will be described with reference to FIG. 7.

FIG. 7 illustrates an example of describing a battery charging information generating method.

To measure F values, the battery charging apparatus charges a battery using a CC/CV charging scheme of a specific C-rate or a step charging scheme including the specific C-rate. Referring to FIG. 7, the battery charging apparatus charges a battery having a temperature of 25° C. and an SOH of 100% using a CC/CV charging scheme 701 of which a C-rate is 0.5 C. The battery charging apparatus maps F values 705 measured in response to charging the battery using the CC/CV charging scheme 701 of 0.5 C to 0.5 C and the increasing SOCs. Likewise, the battery charging apparatus maps F values 706 measured in response to charging the battery using a CC/CV charging scheme 702 to 0.6 C and increasing SOCs.

The battery charging apparatus maps F values 705, 706, and 707 measured in response to charging the battery using CC/CV charging schemes 701, 702, and 703 of various C-rates to the respective corresponding C-rates and SOCs. Also, the battery charging apparatus maps F values 708 measured in response to charging the battery using a step charging scheme 704 to the respective C-rates and SOCs.

The battery charging apparatus generates an F mapping relationship 709 corresponding to the battery having the temperature of 25° C. and the SOH of 100% based on F values measured using the CC/CV charging scheme of various C-rates and the step charging scheme. In one example, if F values measured using the CC/CV charging scheme overlap F values measured using the step charging scheme, an F value corresponding to a corresponding C-rate and an SOC is determined by calculating an average or a weight. Referring to FIG. 7, since the F values 708 measured using the step charging scheme 704 overlap the F values 705, 706, and 707 measured using the CC/CV charging schemes 701, 702, and 703, an F value corresponding to a corresponding C-rate and an SOC is determined based on a combination of overlapping F values.

Referring again to FIG. 6, in operation 602, the battery charging apparatus generates F mapping relationships corresponding to temperatures including the specific temperature and SOHs including the specific SOH, based on the F mapping relationship. The battery charging apparatus may generate F mapping relationships corresponding to the temperatures and the SOHs by repeatedly generating the F mapping relationship described with FIG. 7 under conditions of various temperatures and SOHs.

FIG. 8 illustrates an example of describing a battery charging information generating method.

FIG. 8 illustrates F mapping relationships corresponding to different SOHs if a temperature of a battery is 25° C. The battery charging apparatus generates F mapping relationships corresponding to temperatures and SOHs, records the generated F mapping relationships in a database, and uses the recorded F mapping relationships to derive a charging profile of the battery.

Figure 9:
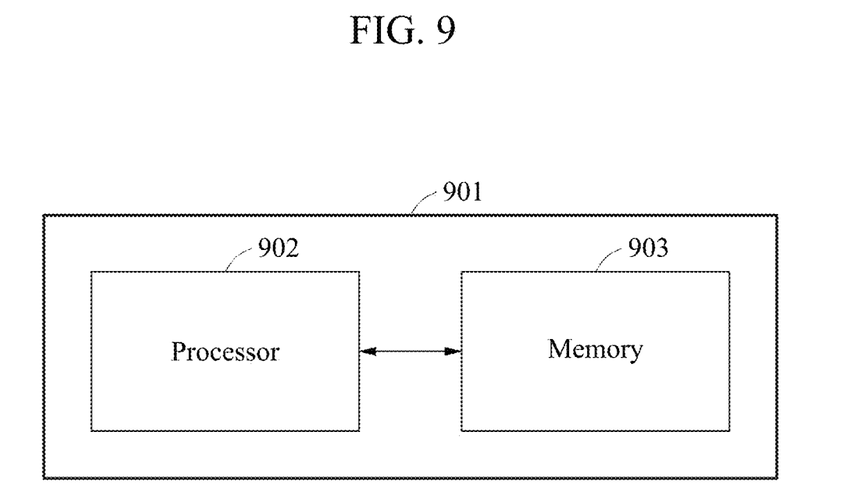
FIG. 9 is a block diagram illustrating an example of a battery charging apparatus.

FIG. 9 illustrates an example of a battery charging apparatus.

Referring to FIG. 9, a battery charging apparatus 901 includes a processor 902 and a memory 903. The processor 902 includes any one or any combination of the apparatuses described with FIGS. 1 through 8, or performs any one or any combination of the methods described with FIGS. 1 through 8. The memory 903 stores F mapping relationships, or stores a program in which the battery charging method and the battery charging information generating method are configured. The memory 903 is, for example, a volatile memory or a nonvolatile memory.

The processor 902 executes the program and controls the battery charging apparatus 901. A code of the program executed by the processor 902 is stored in the memory 903. The battery charging apparatus 901 may be connected to an external apparatus, for example, a personal computer or a network, through an I/O device (not shown), and may exchange data.

In the case of using a charging profile generated according to the examples to charge a battery, the battery may be charged at a charging time desired by a user. Also, in response to charging the battery with the charging profile, it is possible to prevent a battery degradation from occurring due to fast charging of the battery, thereby enhancing a battery life characteristic of the battery.

The processor 602 in FIG. 9 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1, 5, and 6 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:
1. A battery charging method, comprising:
   measuring a temperature of a battery;
   estimating a state of charge (SOC) and a state of health (SOH) of the battery;
   acquiring an F mapping relationship that maps F values to C-rates and SOCs at the measured temperature and the estimated SOH, the F value denoting a ratio of variation of SOC to variation of voltage; and
   generating a charging profile that is a sequence of charging C-rates for each of the SOCs for charging the battery based on the estimated SOC and the F mapping relationship;
   wherein the generating of the charging profile comprises:
   extracting F values corresponding to the estimated SOC from the F mapping relationship;
   determining a charging C-rate corresponding to the estimated SOC based on the F values corresponding to the estimated SOC;
   extracting F values corresponding to a subsequent SOC of the estimated SOC from the F mapping relationship; and
   determining a charging C-rate corresponding to the subsequent SOC based on the F values corresponding to the subsequent SOC.

2. The battery charging method of claim 1, wherein the determining of the charging C-rate corresponding to the estimated SOC comprises determining a C-rate corresponding to a largest F value among the F values corresponding to the estimated SOC extracted from the F mapping relationship as the charging C-rate corresponding to the estimated SOC.

3. The battery charging method of claim 1, wherein the determining of the charging C-rate corresponding to the subsequent SOC comprises:
   extracting C-rates corresponding to the subsequent SOC from the F mapping relationship;
   determining C-rates greater than the charging C-rate corresponding to the estimated SOC within a predetermined range among the extracted C-rates, as candidate C-rates; and
   determining a C-rate corresponding to a largest F value among F values corresponding to the candidate C-rates as the charging C-rate corresponding to the subsequent SOC.

4. The battery charging method of claim 1, wherein the determining of the charging C-rate corresponding to the subsequent SOC comprises:
   extracting C-rates corresponding to the subsequent SOC from the F mapping relationship;
   determining C-rates less than the charging C-rate corresponding to the estimated SOC among the extracted C-rates, as candidate C-rates; and
   determining a C-rate corresponding to a largest F value among F values corresponding to the candidate C-rates as the charging C-rate corresponding to the subsequent SOC.

5. The battery charging method of claim 1, wherein the generating of the charging profile comprises:
   deriving the charging C-rates for each of the SOCs that minimize a value of a fitness function from the F mapping relationship using a genetic algorithm, and
   the fitness function is designed so that any one or any combination of the F values, the C-rates, and the SOCs mapped based on the F mapping relationship is input.

6. The battery charging method of claim 5, wherein the fitness function is designed so that a C-rate corresponding to an SOC to be input to the fitness function is input to the fitness function as a small value according to an increase in the SOC to be input to the fitness function.

7. The battery charging method of claim 1, further comprising:
   receiving a required charging time that is a charging time desired by a user,
   wherein the generating of the charging profile comprises:
   determining whether the battery is chargeable within the required charging time based on the estimated SOC and the required charging time; and
   generating the charging profile for charging the battery within the required charging time in response to the battery being determined to be chargeable.

8. The battery charging method of claim 7, wherein the generating of the charging profile comprises:
generating charging profiles corresponding to the required charging time from the F mapping relationship in response to the battery being determined to be chargeable; and
generating the charging profile using a charging profile having a largest end of life (EOL) among the generated charging profiles.

9. The battery charging method of claim 7, wherein the determining whether the battery is chargeable comprises comparing the required charging time to a threshold time corresponding to the estimated SOC or determining whether the battery is chargeable based on the F values.

10. The battery charging method of claim 7, wherein the generating of the charging profile comprises inserting at least one rest period between the charging C-rates.

11. A battery charging information generating method, comprising:
generating an F mapping relationship of a battery corresponding to a specific temperature of the battery and a specific state of health (SOH) of the battery by mapping F values for each C-rate to states of charge (SOCs), the F value denoting a ratio of variation of SOC to variation of voltage; and
generating F mapping relationships corresponding to battery temperatures including the specific temperature, and to SOHs including the specific SOH, based on the F mapping relationship,
wherein the generating of the F mapping relationship comprises:
measuring F values corresponding to SOCs that increase in response to charging the battery of the specific temperature and of the specific SOH at a specific C-rate; and
mapping the measured F values to the specific C-rate and the increasing SOCs.

12. The battery charging information generating method of claim 11, wherein the measuring of the F values comprises one or both of:
charging the battery using a constant current/constant voltage (CC/CV) charging scheme of the specific C-rate; and
charging the battery using a step charging scheme including the specific C-rate.

13. The battery charging information generating method of claim 12, wherein the measuring of the F values comprises measuring the F values corresponding to the increasing SOCs based on F values measured in response to charging the battery using the CC/CV charging scheme and F values measured in response to charging the battery using the step charging scheme.

14. A non-transitory computer-readable medium storing computer program instructions that, when executed by a processor, cause the processor to implement the method of claim 1.

15. A battery charging apparatus, comprising:
a processor configured to:
measure a temperature of a battery;
estimate a state of charge (SOC) and a state of health (SOH) of the battery;
acquire an F mapping relationship that maps F values to C-rates and SOCs at the measured temperature and the estimated SOH, the F value denoting a ratio of variation of SOC to variation of voltage;
generate a charging profile that is a sequence of charging C-rates for each of the SOCs for charging the battery based on the estimated SOC and the F mapping relationship;
extract F values corresponding to the estimated SOC from the F mapping relationship;
determine a charging C-rate corresponding to the estimated SOC based on the F values corresponding to the estimated SOC;
extract F values corresponding to a subsequent SOC of the estimated SOC from the F mapping relationship; and
determine a charging C-rate corresponding to the subsequent SOC based on the F values corresponding to the subsequent SOC.

16. The battery charging apparatus of claim 15, wherein the processor is further configured to derive the charging C-rates for each of the SOCs that minimize a value of a fitness function from the F mapping relationship using a genetic algorithm, and the fitness function is designed so that any one or any combination of the F values, the C-rates, and the SOCs mapped based on the F mapping relationship is input.

17. The battery charging apparatus of claim 15, wherein the processor is further configured to:
receive a required charging time that is a charging time desired by a user;
determine whether the battery is chargeable within the required charging time based on the estimated SOC and the required charging time; and
generate the charging profile for charging the battery within the required charging time in response to the battery being determined to be chargeable.

18. The battery charging apparatus of claim 17, wherein the processor is further configured to:
generate charging profiles corresponding to the required charging time from the F mapping relationship in response to the battery being determined to be chargeable; and
generate the charging profile using a charging profile having a largest end of life (EOL) among the generated charging profiles.

* * * * *